(12) United States Patent
Torkelsson et al.

(10) Patent No.: US 7,054,996 B2
(45) Date of Patent: May 30, 2006

(54) METHOD AND DEVICE FOR STORING AND MATCHING ARBITRARY WIDE EXPRESSIONS TO CONTENT ADDRESSABLE MEMORIES

(75) Inventors: Kjell Gunnar Torkelsson, Skarpnäck (SE); Johan Mathijs Ditmar, Skarpnäck (SE); Lars-Örjan Kling, Södertälje (SE); Håkan Otto Ahl, Uppsala (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 436 days.

(21) Appl. No.: 10/473,965

(22) PCT Filed: Apr. 3, 2001

(86) PCT No.: PCT/SE01/00719

§ 371 (c)(1),
(2), (4) Date: Oct. 1, 2003

(87) PCT Pub. No.: WO02/082458

PCT Pub. Date: Oct. 17, 2002

(65) Prior Publication Data

US 2004/0111556 A1    Jun. 10, 2004

(51) Int. Cl.
*G06F 12/00* (2006.01)
(52) U.S. Cl. ..................... 711/108; 711/154
(58) Field of Classification Search ................ 711/108, 711/154, 100, 158
See application file for complete search history.

(56) References Cited

U.S. PATENT DOCUMENTS

| 2002/0042865 A1* | 4/2002 | McKenzie et al. ......... 711/158 |
| 2003/0028713 A1* | 2/2003 | Khanna et al. ............ 711/108 |
| 2003/0058671 A1* | 3/2003 | Lindahl et al. ............ 365/49 |

* cited by examiner

*Primary Examiner*—Kimberly McLean-Mayo

(57) ABSTRACT

The present invention relates to a method for storing arbitrarily wide expressions (31) in a set of Content Addressable Memory (CAMs) elements (33) where each CAM element is of lesser width than the expression (31). The CAM element may be a physical CAM or part of a physical CAM. The invention also relates to a method for searching wide expressions in such sets of CAM elements (33). The invention further relates to a device and a computer program for performing the method.

19 Claims, 7 Drawing Sheets

US 7,054,996 B2

METHOD AND DEVICE FOR STORING AND MATCHING ARBITRARY WIDE EXPRESSIONS TO CONTENT ADDRESSABLE MEMORIES

TECHNICAL FIELD

The present invention relates to a method for storing wide expressions in a Content Addressable Memory (CAM) comprising a set of CAM elements of less width and matching of wide expressions to the contents of the set of CAM elements.

BACKGROUND OF THE INVENTION

A Content Addressable Memory (CAM) is a memory device that has become increasingly valuable during the recent years in some applications. A CAM can perform fast storing and search operations. The CAM provides a performance advantage over memory search algorithms such as binary and tree based searches or look-aside tag buffers by comparing the desired information against the entire list of pre-stored data simultaneously often resulting in an order-of-magnitude reduction of search time. Once information is stored in a CAM location, it is found by comparing every bit in the CAM with the bits of the data in a search expression. If there's a match for every bit in a location with every corresponding bit in the search expression, an output is obtained from the CAM, which is an association value or address pointing to associated information. The associated information may be stored in a conventional memory device such as a RAM. Depending on the application, the RAM can contain information or instructions or operations or the like to be displayed or performed when there is a match between the search expression and the information stored in the CAM. Thus, with a CAM, the data is supplied and the address is obtained.

Because the CAM doesn't need address lines to find data, the depth of a memory system using CAMs can be extended as far as desired, but the width is limited by the size of the chip. For example, a CAM chip can be 64 to 128 bits wide, but 32768 entries deep. It is fairly easy to extend the depth of the CAM, because the addressing is all self-contained.

Some CAMs are so called ternary CAMs in which the stored data can contain bit values of 0, 1 or X, where X is "don't care" i e the value matches both 0 and 1.

The function and advantages of the CAM memory makes it very suitable for applications and operations such as LANs, data base management, file-storage management, look-up to pattern recognition, and the like, and is particularly suited to performing search operations. For example, the CAM's may be utilised in connection with Internet Protocol (IP) classification, which is done in routers. This is the process of classifying IP packets into categories that require special treatment. A subset of IP classification is IP filtering. IP filtering is a security feature that restricts IP traffic by permitting or denying packets by applying certain rules. This way, users can be restricted to specific domains or applications on the Internet. To perform classification, IP headers of packets that reach a router need to be compared to patterns stored in a table, generating an output that classifies the packet. Usually, this table is stored in memory and matching is done in software.

Due to increasing performance requirements and larger and wider search sets, software-based search algorithms become too slow and alternative implementations need to be considered. One such alternative is to use a CAM. Commercially available CAMs are however not wide enough for IP version 6 (IPv6) classification. At the present the widest CAMs available are 136 bits wide, which is enough to contain a 128-bits wide IPv6 address. However, when classifying packets in a router, it is necessary to look at a number of fields in the header such as the destination address, which is 128 bits wide, and the source address, which is also 128 bits wide. Further information may also be required to be looked at, which in total may require several hundred bits. It is thus not possible to use the commercially available CAMs in an IPv6 router in a conventional manner.

BRIEF DESCRIPTION OF THE INVENTION

The object of the invention is to provide a method in which CAMs of less width are used to store expressions in CAMs and to match expressions with the contents of CAMs, where the width of the expression is larger than the width of the CAMs used, i. e. emulating a wide CAM with a set of smaller CAMs. The term "expression" in this context is to be understood as comprising a row of an arbitrary number of bits where each bit may be 0, 1 and possibly X if ternary CAMs are used, where the expression forms or contains information or data such as words, addresses, port numbers and the like.

To emulate a wide CAM using a structure of associated less wide CAMs, the wide expression is divided into smaller parts, hereafter named CAM words, where each CAM word is assigned to a CAM element and stored in the CAM element. A CAM element can in this context be a physical CAM or a dedicated part of a CAM. In any event, the CAM element is of a lesser width than the wide expression.

Each CAM word that is stored in the respective CAM element is assigned an association value as output, which value is combined with another CAM word assigned to another CAM element. Such associations between the CAM words of the CAM elements can be made using a serial or a parallel scheme or any combination of these.

In a serial scheme each CAM word is associated to the subsequent CAM word of the stored expression, thus forming a serial connection between the CAM words. In a parallel scheme each CAM word is associated to the last of the CAM words of the stored expression, thus forming a parallel connection between the CAM words.

One CAM word assigned to a CAM element is assigned the output value of the complete expression. This CAM element is referred to as last CAM element. The CAM word of this last CAM element must be associated, directly or indirectly, to all other CAM words of the other CAM elements such that it verifies that all CAM words together form the complete expression.

When performing matching, the expression to be matched, hereafter named the search expression, is divided into smaller parts, search words, where each search word is compared with the contents of the corresponding CAM element, the CAM words, in a sequential order through the CAM element. When a match is obtained between a CAM word of the CAM element and the specific search word, i e a part of the searched expression, the output value of the CAM word is combined with the input of its associated CAM element following the same scheme as above.

The output of the last CAM element will be the resulting output of the total emulated CAM. The output value may be used directly such as for example denying or permitting a packet access to LAN resources when a match is found, or the value may be used in combination with for example a RAM memory, containing information and/or data, such as routing a packet to a specific port in a router when a match is found, where the information regarding the port is stored in a memory location, associated with the stored and matched CAM word.

As a CAM can only return one value, multiple matches are not detected, which could be the case with ternary CAMs where some bits may be X, i e either 0 or 1, and only the output of the CAM word with highest priority is returned. In most CAMs the priority is sequential and falling, i e the CAM words at the top of the CAM have higher priority, mainly because of the sequential way of searching. However, there might be other priority orders such as rising or that each stored CAM word receives an individual priority regardless of its position in the CAM. However, the CAM word with highest priority might not be part of the complete matching expression, but a CAM word with lower priority is. To resolve this, additional CAM words, called "shares", are added to the CAM.

Shares are the result of an operation on a number of stored CAM words. If two CAM words intersect, i e there exist search words for which both these CAM words match, a share has to be created. The creation of the share is such that for those bits of the compared CAM words that are equal, the corresponding bits of the share receive that value, and for those bits that are X in one of the CAM words and defined (0 or 1) in the other CAM word, the corresponding bits of the share receive the defined value. In that way the share will match all search words for which all its arguments match. It is further necessary to prioritise the share over the CAM words from which it was created, i e store the share above them, in order for it to cover or shadow them, so that in a search, the search word reaches the share first.

According to the invention, the CAM elements may be divided into levels with different priority, such that shares created due to two intersecting CAM words are placed on a higher level than the intersecting words, thereby ensuring and facilitating the prioritisation of the shares in relation to the CAM words.

Using shares it is possible to detect multiple matches using one output value. In this way all complete expressions that possibly match are explored.

To cover all possible cases of multiple matches in a CAM element, all possible shares must be added, based on any combination and number of CAM words that can match simultaneously. Furthermore, each share must be added, such that it is prioritised over the original CAM words and also over other shares that have fewer arguments.

Finally, CAM words can be omitted if the union of all CAM words that have a higher priority shadows them. With the method according to the invention, wide expressions can be stored in a set of smaller CAMs. This enables efficient searches for expressions with arbitrary width using commercially available circuits. An alternative to the method according to the invention is a memory-based algorithm, such as a binary or tree-based search. CAMs supply the performance advantage over this kind of algorithms, by comparing the expression that we want to match against the entire list of pre-stored CAM words simultaneously, giving orders-of-magnitude reduction in the search time. Using CAMs, searches are done in constant time and the search time merely depends on the required number of CAM calls and therefore the width of the expressions.

These and other advantages and aspects of the invention will become apparent from the following detailed description and from the accompanying drawings.

BRIEF DESCRIPTION OF THE DRAWINGS

In the following detailed description of the invention, reference will be made to the accompanying drawings, of which

DETAILED DESCRIPTION OF THE INVENTION

Figure 1:
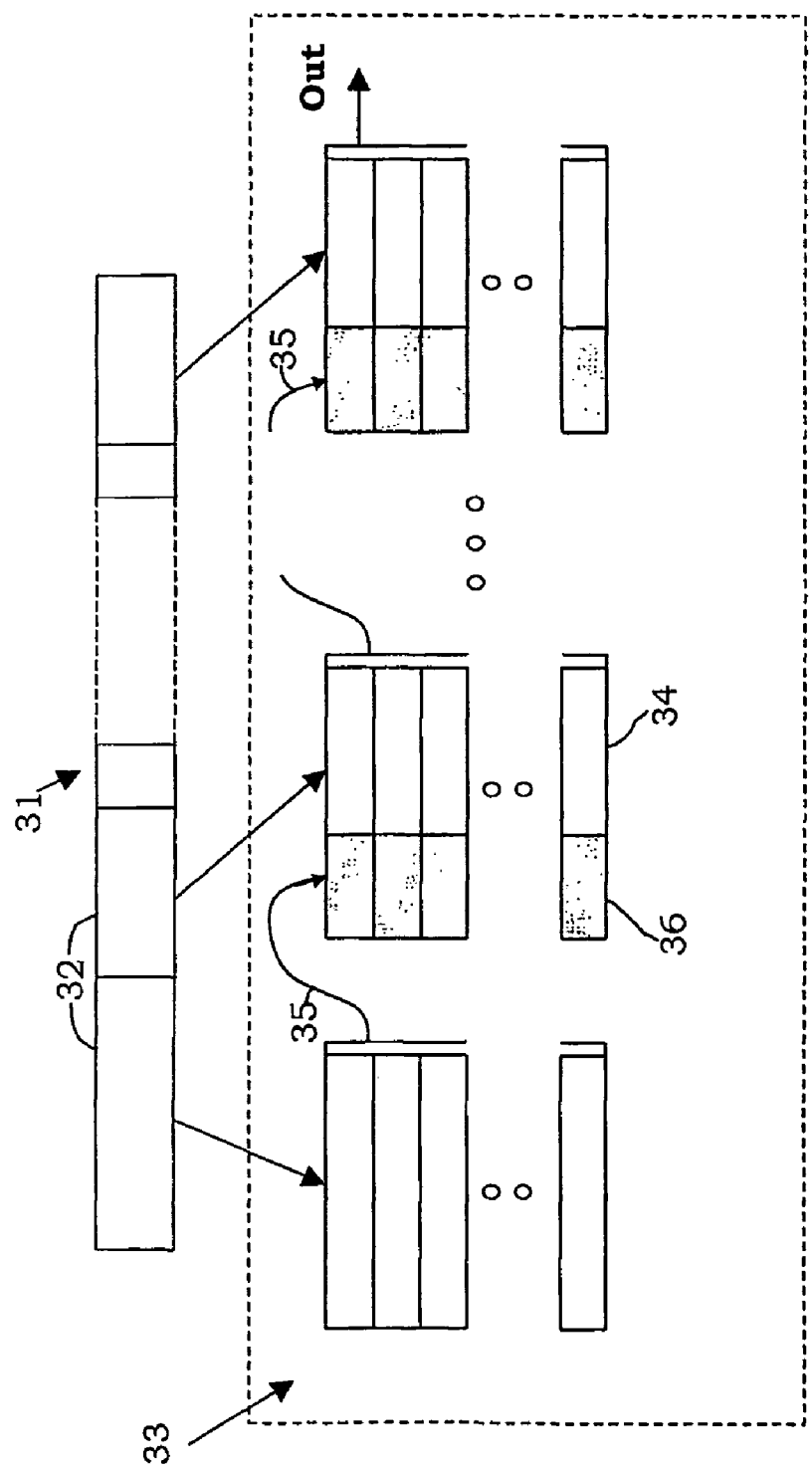
FIG. 1 shows a schematic representation of storing wide search expressions in smaller CAM elements using a serial scheme according to the invention.

The present invention relates to storing and searching in CAMs and in particular ternary CAMs. Searches in a CAM are done by comparing a search expression, which is supplied as input to the CAM, with patterns (CAM words) that are stored in the CAM. If a CAM word matches the search expression, a match is indicated and an output value is returned. The output value may be an address that can be used to access a memory, for example a RAM memory, where the corresponding output value for this match is specified. In this document the term CAM refers to this combination.

In a ternary CAM, CAM words can contain bit-values of 0, 1 and X, where X matches both 0 and 1 in the search word.

Assume that the expressions or entries that are used and are to be stored are wider than the width of the CAM used.

According to the invention the expression 31 is divided into parts, here named CAM words 32. Each part is stored in a location of a CAM element 33, wherein each CAM element 33 is less wide than the total width of the expression 31. Each CAM element 33 can either be a physical CAM or a dedicated part of a CAM and can be of different size in terms of bit width and number of storage locations (depth of the CAM). If the CAM elements are arranged in one physical CAM, parts of the bits of the CAM can be used to indicate that a certain number of locations belong to a certain CAM element. Each CAM word 32 of the expression is stored in a word field 34 of a specific CAM element and each CAM word is connected to other CAM words by using an association value 35 (symbolically indicated by means of an arrow in FIG. 1 and FIG. 2), where the association value 35 is the output value from one CAM word and where the association value is arranged in an appendix, hereafter named selection field 36, connected to the word field 34 of the associated CAM word in another CAM element 33. At least one of the CAM elements 33 has a selection field 36.

One approach according to the invention is to combine these CAM elements 33 serially. The serial scheme may be described as follows: test the number of bits that fits in the first CAM element and store this part of the expression 31, the CAM word 32, in the word field 34 of the CAM element 33. A subsequent number of bits of the expression are tested against the next CAM element and this CAM word is stored in the next CAM element. The association value 35 of the first CAM word is entered into the selection field 36 of the subsequent CAM word. The process is repeated until the whole expression is stored in CAM elements 33, where each CAM word is associated with the subsequent CAM word by the association values 35, FIG. 1.

FIG. 1 can, apart from illustrate storing of wide expressions 31, be used to illustrate matching of a search expression with expressions stored in CAMs. In the following description of matching the reference numeral 31 refer to a search expression and the reference numeral 32 to a search word.

When matching is to be performed, the search expression 31 is divided into a number of parts, search words 32, where each search word 32 has a bit width corresponding to its CAM element 33. The first search word 32 is compared to the CAM words in the word fields 34 of the first CAM element. When a match is obtained, the output value from the matched CAM word, the association value 35, is combined with the next search word. The next search word, together with the association value 35 obtained from the first match, is tested against the CAM words in the second CAM element. When a match is obtained between the search word 32 and a CAM word and the association value 35 combined to the search word matches the contents of the selection field 36, an output value is obtained, association value 35, which in turn is combined with the next part of the expression. The process continues until a match is obtained between all search words and the CAM words of the CAM elements.

When a complete match is obtained of the specific CAM word, an association value for the complete expression is returned. The association value may be used as an address to a conventional RAM memory.

The number of CAM elements 33 that is needed to match the wide search word 31 is such that the total width of all word fields 34 is larger or equal to the width of the search word that is to be matched.

Figure 2:
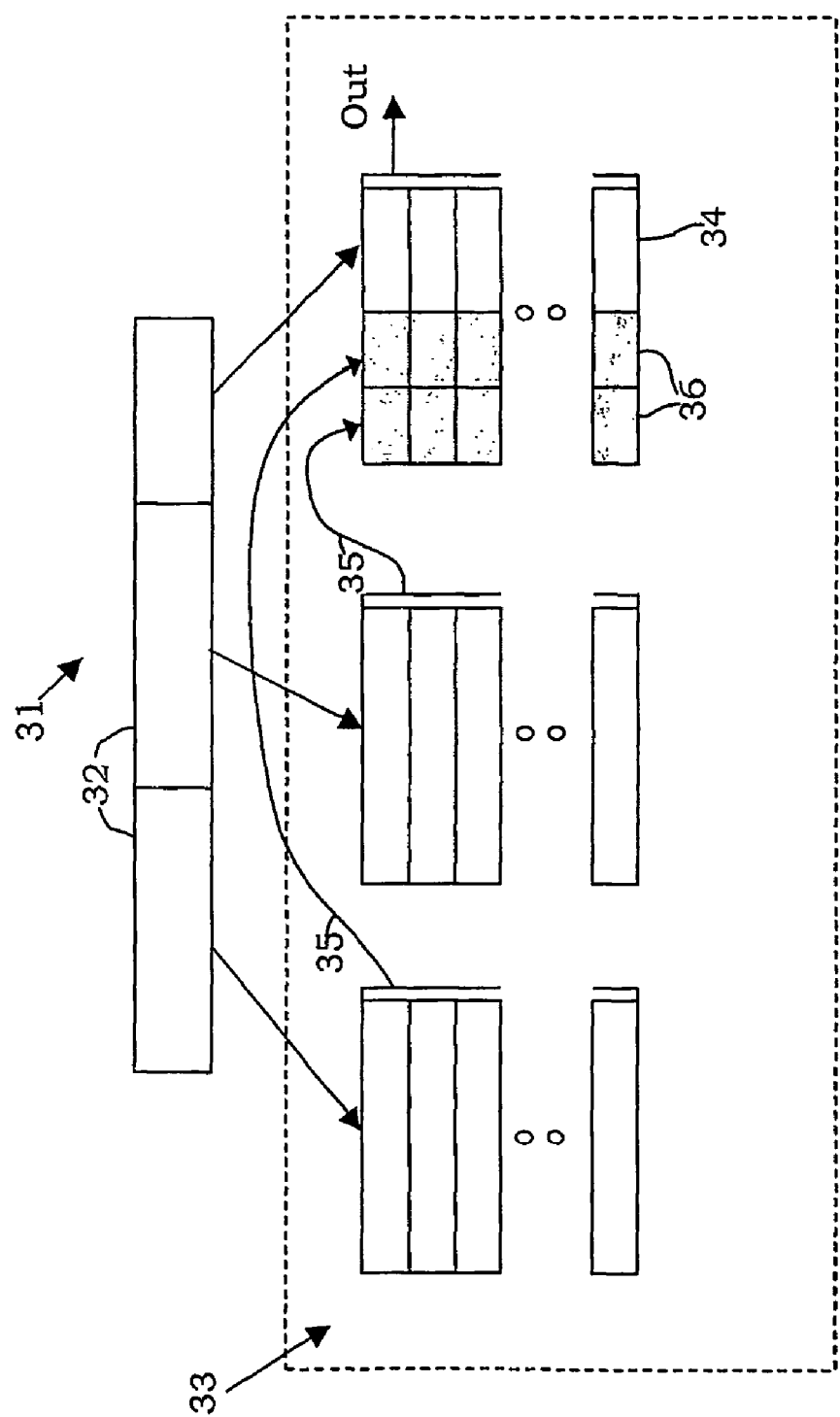
FIG. 2 shows a schematic representation of storing wide search expressions in three smaller CAM elements using a parallel scheme according to the invention, FIG. 3 a–e show connection between CAM words in different CAM elements.

Another approach according to the invention is to use a parallel scheme. With the parallel scheme the width of the expression 31 is checked in order to establish the number of CAM elements 33 required for storing, based on knowledge of the width of each CAM element available. The first part of the expression, the first CAM word 32, is stored in a word field 34 in a first CAM element. The association value 35 of the CAM word is entered into a selection field 36 of the last CAM element required for storing the particular expression 31. The next part of the expression is stored in the word field of another CAM element and its association value 35 is entered in a further selection field 36 in the last CAM element. The process continues until all parts of the expression are stored in CAM elements 33. The last CAM element has thus a number of selection fields 36 corresponding to the number of CAM elements used for storing the expression except for the last part of the expression (if there is any). This scheme is illustrated in FIG. 2 for three CAM elements.

When a matching is to be performed with the parallel scheme, the first part of the search expression 31, search word 32, is compared to the contents of the word fields 34 of the first CAM element 33. When a match is obtained between the search word 32 and a CAM word, the association value 35 of the CAM word is entered as input in the last CAM element. The other parts of the search expression 31 are compared in the same way to the CAM words of the corresponding CAM elements. Each match generates an association value 35, which is used as input in the last CAM element. In the last CAM element in the parallel scheme the association values 35 of all the previous CAM elements 33 are combined into a set of selection fields 36, and this set is tested together with the remaining word field (if any).

It is to be understood that the parallel and serial schemes described above can be combined into more complex schemes. For example in a serial structure, each CAM element can be substituted by a parallel structure of CAM elements and vice versa. In this way structures of arbitrary complexity can be built.

One way of forming schemes is to provide the CAM elements with a control bit. The control bit can be used to indicate whether or not the CAM words of the CAM element are provided with selection fields, or in other words if the element follows the serial scheme or the parallel scheme. The control bit may for instance be set to zero if the CAM element does not have selection fields and to one if the CAM element has selection fields. Schemes that are simple combinations of the parallel and the serial schemes can be formed by means of using a single control bit. More than one control bit may be required to form more complex schemes.

In general the serial scheme requires less CAM entries than parallel, while the parallel scheme favors search time, especially if parallel branches are assigned to different physical CAMs.

The schemes above work as described if there are only single matches in the CAM elements, i e when the bits of the search word and CAM words can have only defined values 0 or 1. When ternary CAMs are used, the CAM words can contain bit-values of 0, 1 and X, which makes multiple matches possible. X matches both 0 and 1 in the search word. If multiple matches are possible, only the most prioritized match in the CAM is detected. This word might not be part of the complete matching expression, but a CAM word with lower priority is.

Figure 3A:
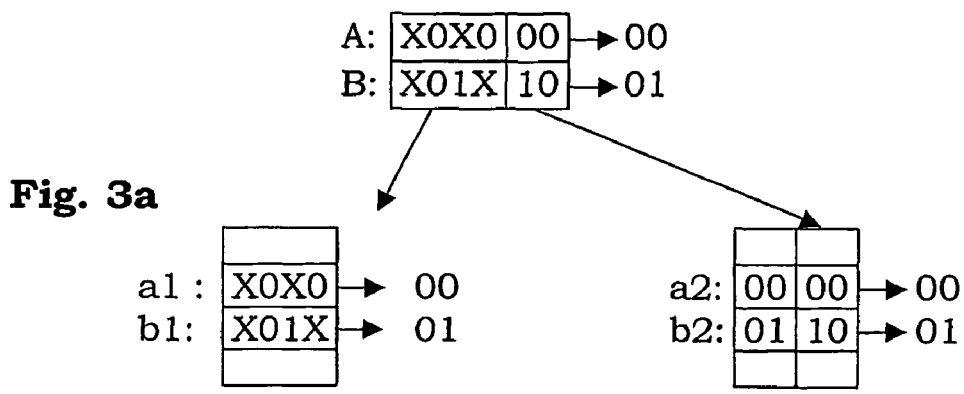

An example of this is shown in FIG. 3a. Assume that we have two expressions A: x0x000 and B: x01x10 with output values 00 and 01 respectively as shown in FIG. 3a. Suppose further that the CAM elements used have word fields that can contain maximum four bits each and have a falling priority order. In reality, the CAM elements can be, and are almost always, wider than that, but four is used here for clarity. A and B are stored according to the invention such that the four first bits, CAM words a0 and b0, of the expressions are stored in the first CAM element. These CAM words are given output values 00 and 01 respectively. The rest of the bits, CAM words a1 and b1, of the expressions A and B are stored in the subsequent CAM element, where the selection fields of these CAM words are given the corresponding values 00 and 01 respectively. The output values of the expressions A and B are assigned to the last CAM element.

Figure 3B:
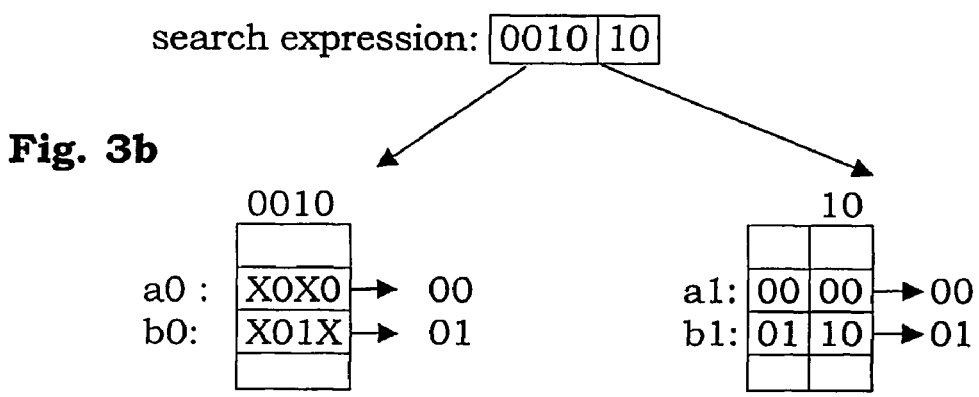

If a search expression like 001010 is to be matched against the contents of the CAM elements, FIG. 3b, the search expression is divided so that the first four bits, search word, are compared to the CAM words of the first CAM element. As can be seen from the figure, the search word matches both CAM words a0 and b0 because of the X values in bits three and four of a0 and b0. However, only a0 is checked and matched since it is higher up, prioritized. The match will produce an output value 00, which is combined with the subsequent search word 10. This will however not produce a match in the subsequent CAM element since 0010 is not stored there. This is because the match in the first CAM element was not a correct match.

The solution according to the invention is to convert the CAM words in CAM elements that have an associated CAM in such a way, that only single matches are possible.

Figure 4:
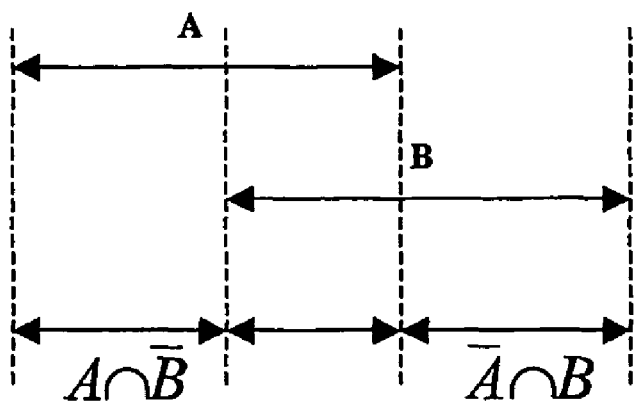
FIG. 4 shows CAM words A and B represented as numeric ranges.

In FIG. 4 two CAM words, A and B, are represented as a "range" of numeric values representing CAM words for which they match. Observe that these ranges are not necessarily contiguous but represent the set of search words that match a CAM word consisting of a number of bits, where the bits can have values 0, 1 and X.

In order to achieve only single matches, A and B can be replaced with three expressions:

1. values that match both A and B,
2. values that match only A,
3. values that match only B.

According to the invention, an expression "share" is used, with which it is possible to construct the expression 1, i. e. that matches both A and B. The expression "share" will be defined and described in detail below. There is however no easy way to express the cases 2 and 3.

Figure 5:
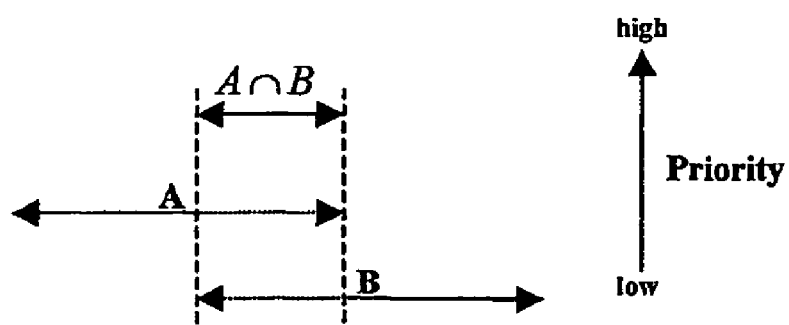
FIG. 5 shows CAM words A, B and A∩B represented as numeric ranges.

This is solved by using the fact that the CAM prioritizes matches as described above, for example according to the order the expressions are stored, see FIG. 5.

FIG. 5 illustrates that the three ranges in FIG. 4 can be represented by the expressions "A∩B" (A and B) and the original expressions provided that A∩B is prioritized thereby "shadowing" the unwanted ranges of A and B.

The share of two words can be calculated using the bit-wise operator defined in Table 1 below. If one or more bits in the result of this operator contain Ø, there is no share.

TABLE 1

| | A | | |
|---|---|---|---|
| B | 0 | 1 | X |
| 0 | 0 | Ø | 0 |
| 1 | Ø | 1 | 1 |
| X | 0 | 1 | X |

Suppose that two wide expressions A and B are stored in CAM elements. A and B have been divided into parts $a_0$, $a_1$, ... and $b_0$, $b_1$, ... that are added to different CAM elements as described above in connection to FIG. 3a.

If $a_0 \cap b_0 \neq \emptyset$, as shown in FIG. 3a and b, it is necessary to add a share in the first CAM element. The share is created by using the bit operator, and in the example shown in FIGS. 3a–c the share obtains the value X010. In order to prioritise the share it is placed above the CAM words. This share must further be assigned an association value that matches the selection fields of both $a_1$ and $b_1$ in order to perform the share operation.

Figure 3C:
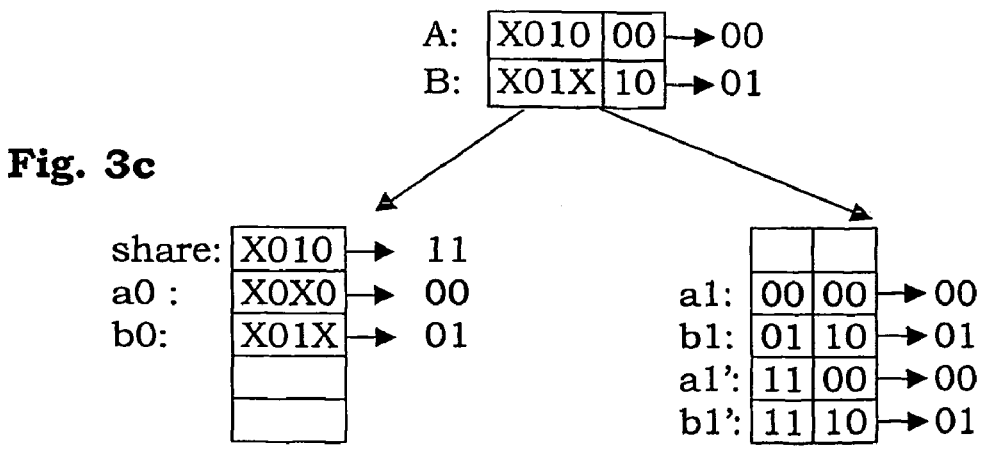

One way to achieve this effect is to create copies of $a_1$ and $b_1$ ($a_1'$ and $b_1'$ respectively) and assign selection fields matching the association value of $a_0 \cap b_0$, FIG. 3c. In the case shown, the association value of the share is set to 11, as so are the selection fields of the copies.

Figure 3D:
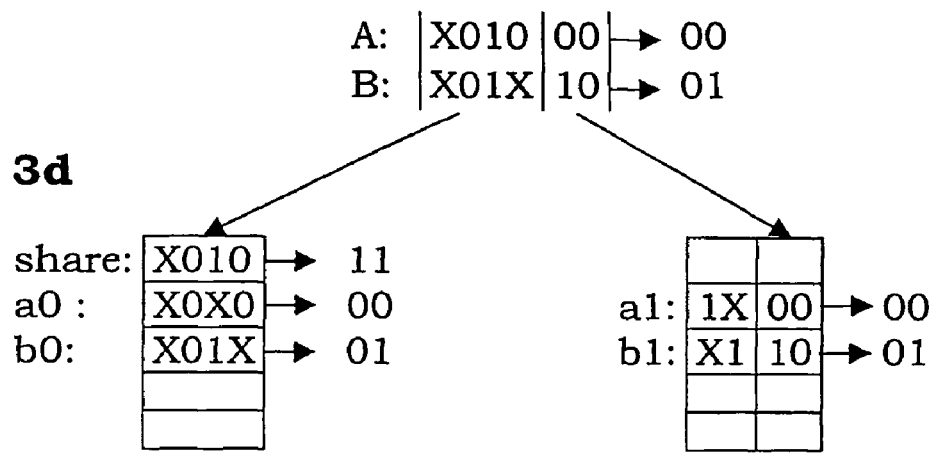
Figure 3E:
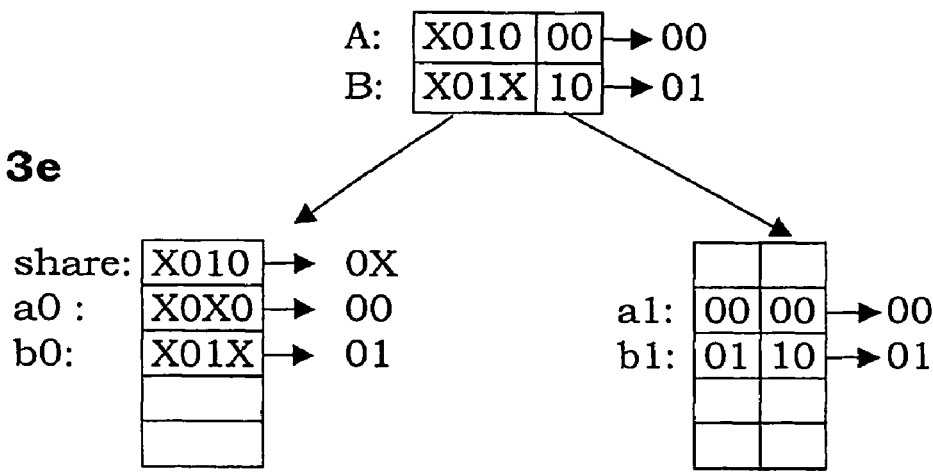

Another way to achieve the effect is to use X values in the selection fields of $a_1$ and $b_1$, FIG. 3d, and/or X in association value of $a_0 \cap b_0$, FIG. 3e, such that $a_1$ and $b_1$ need not to be copied.

The concept of shares can be extended for any number of CAM words. The share of X CAM words is then defined as the set of patterns, for which all these CAM words match.

Figure 6:
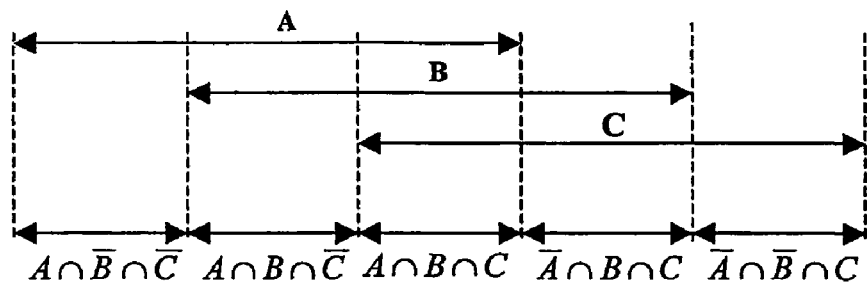
FIG. 6 shows CAM words A, B and C represented as numeric ranges.

Suppose that three entries A, B and C are added to a CAM element and that their numerical ranges intersect as shown in FIG. 6.

Figure 7:
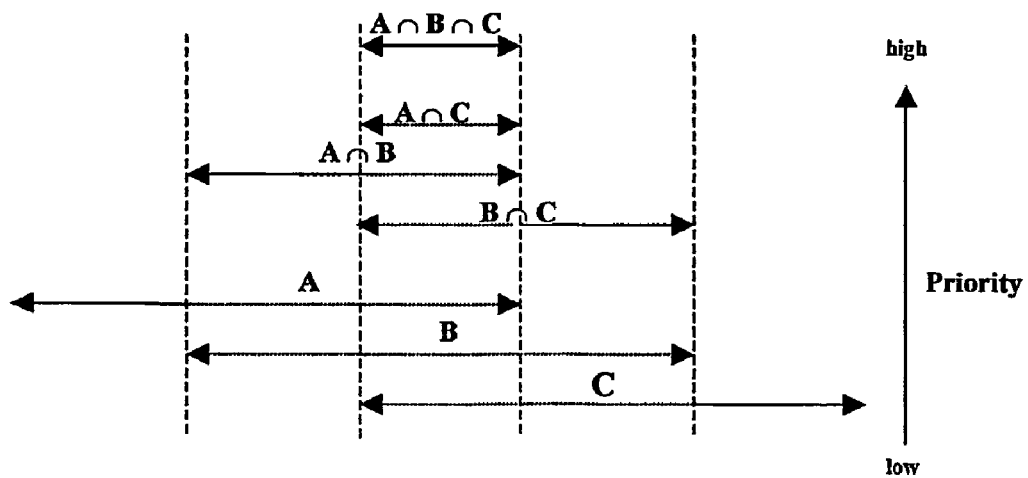
FIG. 7 shows CAM words A, B and C represented as numeric ranges and the use of shares according to the invention.

To achieve only single matches, it is not enough to add the share of A, B and C (A∩B∩C), because this only covers the case when all three CAM words match. To cover the cases when only A and B, A and C or B and C match, we should add A∩B, A∩C and B∩C as well, as shown in FIG. 7. In general, all shares of any number and combination of CAM words should be added such that all combinations of multiple matches are covered.

In this example, CAM words B and A∩C are completely shadowed by CAM words that are prioritised because CAM words higher up in the CAM are prioritised such that the share is prioritised. B and A∩C can therefore never return their value and can be omitted.

The checking whether CAM words intersect may be performed either each time a new CAM word is to be stored or after a set of CAM words are stored.

In some instances the resulting share of two intersecting CAM words is the same as one of the CAM words. As an example, a CAM word 10XX to be stored is checked against the CAM words contained in the CAM element. Suppose that one of the CAM words is 1XXX. According to the invention, since they intersect, a share is required because of the second bits. However, the resulting share 10XX is the same as the CAM word to be stored, i e if the CAM word would be entered, it would completely shadowed by the share because of the priority. Therefore, the shadowed CAM word need not be entered and the share obtains the association value that the CAM word was to receive. It might also be that the share is the same as a stored CAM word. Because of the prioritisation, the share completely shadows, and the shadowed CAM word may be removed, and possibly also the CAM words that it is associated to.

For some applications it is possible to reduce the number of shares required by reducing the number of entries, CAM words, if known restrictions and relationships within data sets can be exploited. For example for IP addresses in many applications, it is only meaningful to have X's in consecutive positions at the end of the word. If this data field is assigned to be the only field in a CAM element, each share will shadow one of its entries, resulting in no extra entries.

The number of entries added as a result of adding shares can be reduced if a suitable scheme of using X values in selection fields is employed. Additionally association values can contain X values by using global input masks. A scheme employing this can also be envisioned to reduce the number of entries.

Figure 8:
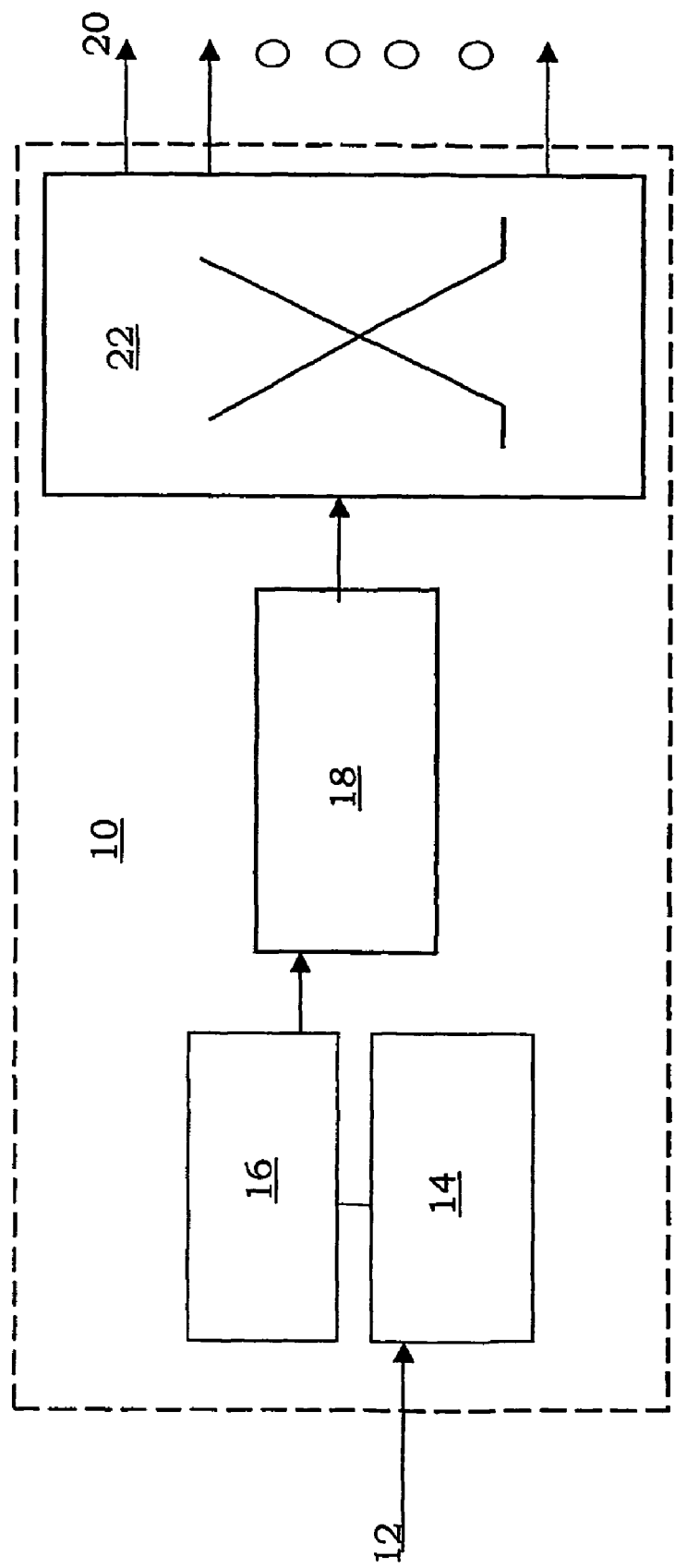
FIG. 8 shows schematically a computing device according to the invention.

The present invention may be implemented in any device intended and used for computing digital information using CAMs, such as for example routers, general purpose computers, and the like. The invention is preferably implemented in the software of the device for performing the storing and matching in the CAM elements. As mentioned before, the invention is applicable to both several smaller CAMs where each CAM is a CAM element, or that one large CAM is divided into several CAM elements, or combination of these. FIG. 8 shows a schematic example of a router 10 in which the present invention may be utilised. In the router the addresses of the incoming packets at the incoming link 12 are checked in the routing table 14 with the table look up function 16, comprising the CAMs and the means for dividing the address information into parts, means for matching the parts in CAM elements, and means for combining the matches in the CAM elements are located. Depending on the result of the match, the packets are then sent to the IP classification function 18 that will decide whether to discard the IP packet, to send it to software for further processing or to send the packet to the outgoing link 20 via a switching device 22.

The output value of the match in the CAM can in this context be used to obtain information from another memory means containing information and data regarding addresses to send the packets to or instructions on how to treat or process the packet. In some applications the IP classification function is positioned before the table look up function. There may also be several other functions and features comprised in the router for handling packets. Since these do not form part of the invention, they will not be described in detail.

The handling of the CAMs according to the present invention is preferably implemented in the software of the computing device in the form of computer program code means or software code portions, although it is of course possible to implement the invention in the hardware of the computing device. The software may be stored in suitable memory means such as ROM, EPROM, RAM, SDRAM, optical or magnetic discs as well as in a distributed fashion.

It is to be understood that the embodiments described above and shown in the drawings are to be regarded as non-limiting examples of the present invention and that the scope of protection is defined by the patent claims.

The invention claimed is:

1. A method of storing expressions of arbitrary width in content addressable memories (CAMs), the method comprising:
   dividing the expression into a number of consecutive CAM words;
   storing each CAM word in a respective physical CAM element;
   associating each CAM word with the other CAM words of the expression where all the associated CAM words express the stored expression;
   if a CAM word intersects with one or more of the CAM words of a CAM element, creating a share, said share being a word consisting of a union of the intersecting CAM words;
   assigning an association value to the share; and
   setting the association value to match the association values of the intersecting words.

2. The method according to claim 1, further comprising:
   assigning an association value to each CAM word; and
   assigning a selection value to each associated CAM word, wherein the selection value matches the association value.

3. The method according to claim 1, further comprising associating each CAM word with its consecutive CAM word.

4. The method according to claim 1, further comprising associating each CAM word with the last CAM word of the expression.

5. The method according to claim 1, further comprising:
   associating at least one first CAM word with its consecutive CAM word; and
   associating at least one second CAM word with a third CAM word, wherein the third CAM word is a CAM word other than the consecutive CAM word of the second CAM word.

6. The method according to claim 1, wherein each CAM element has a width that is less than the width of the expression.

7. The method according to claim 1, further comprising:
   copying the words associated with the matching words; and
   assigning selection fields to the copied words, wherein the selection fields match the association value of the share.

8. The method according to claim 1, further comprising assigning the share a higher priority than the intersecting words.

9. The method according to claim 1, further comprising the step of matching search expressions of arbitrary width with expressions stored in the CAMs, said matching step including:
   dividing the search expression into consecutive search words;
   comparing each of the search words to the CAM words of a respective CAM element of a number of CAM elements in order to obtain a match between the search word and a CAM word; and associating the matches with each other, the associated matches corresponding to the expression, and obtaining an output value from the match.

10. The method according to claim 9, wherein each CAM word is associated with its consecutive CAM word, and a match between a search word and a CAM word provides an association value that is used together with the consecutive search word for matching the consecutive search word with the CAM words of its CAM element.

11. The method according to claim 9, wherein each CAM word is associated with the last CAM word of the expression, and a match between a search word and the CAM words of its CAM element for all search words of the expression provide association values to the last search word of the expression.

12. The method according to claim 9, wherein at least one first CAM word is associated with its consecutive CAM word, and at least one second CAM word is associated with a third CAM word, wherein the third CAM word is a CAM word other than the consecutive CAM word of the second CAM word, and a match between at least one first search word and a CAM word provides a first association value that is used together with the consecutive search word for matching the consecutive search word with the CAM words of its CAM element, and wherein a match between at least one second search word and a CAM word provides a second association value that is used together with at least one other association value for matching one of the search words of the expression.

13. A device for storing expressions of arbitrary width in content addressable memories (CAMs), said device comprising:

means for dividing the expression into a number of consecutive CAM words;

means for storing each word in a respective physical CAM element;

means for associating each CAM word with the other CAM words of the expression where all the associated CAM words express the stored expression;

means for creating a share, said share being a word consisting of a union of any intersecting CAM words in a CAM element;

means for assigning an association value to the share; and means for setting the association value to match the association values of the intersecting words, if a CAM word intersects with one or more of the CAM words of a CAM element.

14. The device according to claim 13, further comprising means for assigning an association value to each CAM word, and for assigning a selection value to each associated CAM word, wherein the selection value matches the association value.

15. The device according to claim 13, further comprising means for matching search expressions of arbitrary width with expressions stored in the CAMs, said matching means comprising:

means for dividing the search expression into consecutive search words;

means for comparing each of the search words to the CAM words of a respective CAM element of a number of CAM elements in order to obtain a match between the search word and a CAM word;

means for associating the matches with each other, the associated matches corresponding to the expression; and means for obtaining an output value from the match.

16. The method according to claim 1, wherein the physical CAM elements comprise a plurality of physical CAMs.

17. The method according to claim 1, wherein the physical CAM elements comprise a plurality of designated parts of one physical CAM.

18. The device according to claim 13, wherein the physical CAM elements comprise a plurality of physical CAMs.

19. The device according to claim 13, wherein the physical CAM elements comprise a plurality of designated parts of one physical CAM.

* * * * *